(12) United States Patent
Kim et al.

(10) Patent No.: US 11,272,611 B2
(45) Date of Patent: Mar. 8, 2022

(54) FLEXIBLE CIRCUIT BOARD WITH IMPROVED BENDING RELIABILITY AND MANUFACTURING METHOD THEREOF

(71) Applicant: GigaLane Co., Ltd., Hwaseong-si (KR)

(72) Inventors: Sang Pil Kim, Hwaseong-si (KR); Byung Yeol Kim, Hwaseong-si (KR); Ik Soo Kim, Hwaseong-si (KR); Hee Seok Jung, Hwaseong-si (KR)

(73) Assignee: GIGALANE CO., LTD., Hwaseong-si (KR)

( * ) Notice: Subject to any disclaimer, the term of this patent is extended or adjusted under 35 U.S.C. 154(b) by 0 days.

(21) Appl. No.: 17/295,488

(22) PCT Filed: Nov. 7, 2019

(86) PCT No.: PCT/KR2019/015034
§ 371 (c)(1),
(2) Date: May 20, 2021

(87) PCT Pub. No.: WO2020/122425
PCT Pub. Date: Jun. 18, 2020

(65) Prior Publication Data
US 2021/0360780 A1   Nov. 18, 2021

(30) Foreign Application Priority Data
Dec. 11, 2018   (KR) .................. 10-2018-0158936

(51) Int. Cl.
*H05K 1/02* (2006.01)
*H05K 3/46* (2006.01)

(52) U.S. Cl.
CPC ......... *H05K 1/0277* (2013.01); *H05K 1/0213* (2013.01); *H05K 3/4644* (2013.01);
(Continued)

(58) Field of Classification Search
CPC .. H05K 1/0277; H05K 1/0213; H05K 3/4644; H05K 2201/0187; H05K 2201/10189
(Continued)

(56) References Cited

U.S. PATENT DOCUMENTS 7,667,650 B2   2/2010  Tiezzi et al.
9,743,511 B1*  8/2017  Chen .................... H05K 3/4691
(Continued)

FOREIGN PATENT DOCUMENTS

JP       2018041767 A     3/2018
KR    1020170036339 A     4/2017
(Continued)

OTHER PUBLICATIONS

International Search Report from International Application No. PCT/KR2019/015034, dated Feb. 20, 2020.

*Primary Examiner* — Sherman Ng
(74) *Attorney, Agent, or Firm* — Brundidge & Stanger, P.C.

(57) ABSTRACT

A flexible circuit board with improved bending reliability and a manufacturing method thereof are disclosed, the flexible circuit board comprising: a first dielectric formed to be elongated in a horizontal direction; a second dielectric positioned above the first dielectric; a third dielectric spaced apart from the second dielectric in the horizontal direction and positioned above the first dielectric; a first cover layer positioned on the first dielectric and covering an upper portion of the first dielectric between the second dielectric and the third dielectric; a first bonding sheet positioned between the first dielectric and the second dielectric and covering an upper portion of one end of the first cover layer; and a second bonding sheet positioned between the first dielectric and the third dielectric and covering an upper portion of the other end of the first cover layer.

9 Claims, 6 Drawing Sheets

(52) U.S. Cl.
CPC ............... *H05K 2201/0187* (2013.01); *H05K 2201/10189* (2013.01)

(58) Field of Classification Search
USPC .......................................................... 174/254
See application file for complete search history.

(56) References Cited

U.S. PATENT DOCUMENTS

| | | | |
|---|---|---|---|
| 2008/0266178 | A1 | 10/2008 | Tiezzi et al. |
| 2009/0133906 | A1* | 5/2009 | Baek .................... H05K 1/0218 |
| | | | 174/254 |
| 2009/0314523 | A1* | 12/2009 | Ito .......................... C09J 163/00 |
| | | | 174/254 |
| 2013/0163253 | A1* | 6/2013 | Saito .................... H05K 1/0274 |
| | | | 362/278 |
| 2016/0095207 | A1* | 3/2016 | Taniguchi ............ H05K 3/4691 |
| | | | 174/252 |
| 2016/0183363 | A1* | 6/2016 | Lee ...................... B23K 26/362 |
| | | | 174/254 |

FOREIGN PATENT DOCUMENTS

| | | |
|---|---|---|
| KR | 1020170036358 A | 4/2017 |
| KR | 1020180024418 A | 3/2018 |

\* cited by examiner

FLEXIBLE CIRCUIT BOARD WITH IMPROVED BENDING RELIABILITY AND MANUFACTURING METHOD THEREOF

CROSS-REFERENCE TO RELATED APPLICATIONS

This Application is the National Stage filing under 35 U.S.C. § 371 of PCT Application Ser. No. PCT/KR2019/015034 filed on Nov. 7, 2019, which claims the benefit of Korean Patent Application No. 10-2018-0158936 filed on Dec. 11, 2018. The disclosures of both applications are hereby incorporated herein by reference in their entireties.

TECHNICAL FIELD

The present invention relates to a flexible circuit board with improved bending reliability and a manufacturing method thereof.

BACKGROUND

A flexible circuit board for transmitting a high frequency signal is used within a wireless terminal (e.g., a smartphone, a tablet or the like).

The flexible circuit board separately forms an area to be bent according to the need of bending due to a step between internal parts or a hinge of the wireless terminal.

As shown in FIG. 1, a thickness of an area to be bent of the flexible circuit board is less than that of other areas, thereby forming a step.

As shown in FIG. 2, by this step, there is a problem that a gap G, which is a part where a cover layer 200 covering an upper portion of the first dielectric 110 is separated from the upper portion of the first dielectric 110, is formed.

As shown in an enlarged view of portion A1 in FIG. 2, this problem is further problematic in that signal transmission is not normally performed since a wiring part 500 that is coupled to the cover layer 200 is separated together with the cover layer 200 in accordance with an increase in size of the gap G when bending the flexible circuit board.

SUMMARY

Technical Problem

An object of the present invention is to provide a flexible circuit board with improved bending reliability and a manufacturing method thereof.

Technical Solution

A flexible circuit board having improved bending reliability according to an embodiment of the present invention includes: a first dielectric formed to be elongated in a horizontal direction; a second dielectric positioned above the first dielectric; a third dielectric spaced apart from the second dielectric in the horizontal direction and positioned above the first dielectric; a first cover layer positioned on the first dielectric and covering an upper portion of the first dielectric between the second dielectric and the third dielectric; a first bonding sheet positioned between the first dielectric and the second dielectric and covering an upper portion of one end of the first cover layer; and a second bonding sheet positioned between the first dielectric and the third dielectric and covering an upper portion of the other end of the first cover layer, wherein one end of the first cover layer is extended and interposed between the first dielectric and the second dielectric, wherein the other end of the first cover layer is extended and interposed between the first dielectric and the third dielectric.

According to an embodiment of the present invention, the flexible circuit board includes a first ground positioned on the second dielectric, while being positioned to be spaced apart from one end of the first cover layer in the horizontal direction so as not to overlap the one end of the first cover layer in a vertical direction; and a second ground positioned on the third dielectric, while being positioned to be spaced apart from the other end of the first cover layer in the horizontal direction so as not to overlap the other end of the first cover layer in the vertical direction.

A flexible circuit board having improved bending reliability according to an embodiment of the present invention includes: a first dielectric formed to be elongated in a horizontal direction; a second dielectric positioned above the first dielectric;

a third dielectric spaced apart from the second dielectric in the horizontal direction and positioned above the first dielectric; a first cover layer positioned on the first dielectric and covering an upper portion of the first dielectric between the second dielectric and the third dielectric; a third cover layer positioned on the second dielectric; and a fourth cover layer positioned on the third dielectric, wherein one end of the first cover layer is extended and interposed between the first dielectric and the second dielectric, wherein the other end of the first cover layer is extended and interposed between the first dielectric and the third dielectric, wherein a thickness of the first cover layer is formed to be less than a thickness of the third cover layer and the fourth cover layer.

A flexible circuit board having improved bending reliability according to an embodiment of the present invention includes: a first dielectric formed to be elongated in a horizontal direction; a second dielectric positioned above the first dielectric; a third dielectric spaced apart from the second dielectric in the horizontal direction and positioned above the first dielectric; a first cover layer positioned on the first dielectric and covering an upper portion of the first dielectric between the second dielectric and the third dielectric; a fourth dielectric positioned below the first dielectric, while being positioned to be line-symmetric with the second dielectric with respect to the first dielectric; a fifth dielectric spaced apart from the fourth dielectric in the horizontal direction and positioned below the first dielectric, while being positioned to be line-symmetric with the third dielectric with respect to the first dielectric; and a second cover layer positioned under the first dielectric and covering a lower portion of the first dielectric between the fourth dielectric and the fifth dielectric; wherein one end of the first cover layer is extended and interposed between the first dielectric and the second dielectric, wherein the other end of the first cover layer is extended and interposed between the first dielectric and the third dielectric, wherein one end of the second cover layer is extended and positioned between the first dielectric and the fourth dielectric, wherein the other end of the second cover layer is extended and positioned between the first dielectric and the fifth dielectric.

According to an embodiment of the present invention, the flexible circuit board includes a third bonding sheet positioned between the first dielectric and the fourth dielectric and covering a lower portion of one end of the second cover layer; and a fourth bonding sheet positioned between the first dielectric and the fifth dielectric and covering a lower portion of the other end of the second cover layer.

According to an embodiment of the present invention, the flexible circuit board includes a third ground positioned under the fourth dielectric, while being positioned to be spaced apart from one end of the second cover layer in the horizontal direction so as not to overlap the one end of the second cover layer in a vertical direction; and a fourth ground positioned under the fifth dielectric, while being positioned to be spaced apart from the other end of the second cover layer in the horizontal direction so as not to overlap the other end of the second cover layer in the vertical direction.

According to an embodiment of the present invention, the flexible circuit board includes a fifth cover layer positioned under the fourth dielectric; and a sixth cover layer positioned under the fifth dielectric, wherein a thickness of the second cover layer is formed to be less than a thickness of the fifth cover layer and the sixth cover layer.

A flexible circuit board having improved bending reliability according to an embodiment of the present invention includes: a first dielectric formed to be elongated in a horizontal direction; a second dielectric positioned above the first dielectric; a third dielectric spaced apart from the second dielectric in the horizontal direction and positioned above the first dielectric; a first cover layer positioned on the first dielectric and covering an upper portion of the first dielectric between the second dielectric and the third dielectric; a third cover layer positioned on the second dielectric; a PSR positioned on the second dielectric and covering an upper portion of one end of the third cover layer; and a connector positioned on the PSR, wherein one end of the first cover layer is extended and interposed between the first dielectric and the second dielectric, wherein the other end of the first cover layer is extended and interposed between the first dielectric and the third dielectric.

According to an embodiment of the present invention, the flexible circuit board includes a second ground positioned on the third dielectric; and a fourth cover layer positioned on the third dielectric and covering the second ground, wherein an opening through which the second ground is exposed is formed in the fourth cover layer so that a ground part is able to be grounded with the second ground.

A manufacturing method of a flexible circuit board with improved bending reliability according to an embodiment of the present invention includes a first step of preparing a first dielectric on which a first cover layer is positioned; a second step of coupling a second dielectric onto the first dielectric through a first bonding sheet to cover one end of the first cover layer; and a third step of spacing a third dielectric apart from the second dielectric in a horizontal direction, and coupling the third dielectric onto the first dielectric through a second bonding sheet to cover the other end of the first cover layer.

A manufacturing method of a flexible circuit board with improved bending reliability according to an embodiment of the present invention includes a first step of preparing a first dielectric on which a first cover layer is positioned; a second step of coupling a second dielectric onto the first dielectric to cover one end of the first cover layer; a third step of spacing a third dielectric apart from the second dielectric in a horizontal direction, and coupling the third dielectric onto the first dielectric to cover the other end of the first cover layer; a fourth step of coupling a third cover layer onto the second dielectric; and a fifth step of coupling a fourth cover layer onto the third dielectric.

A manufacturing method of a flexible circuit board with improved bending reliability according to an embodiment of the present invention includes a first step of preparing a first dielectric on which a first cover layer is positioned; a second step of coupling a second dielectric and a third dielectric that are connected to each other without being separated, onto the first dielectric, wherein the first dielectric and the second and third dielectrics connected to each other are coupled through a first bonding sheet and a second bonding sheet that are connected to each other without being separated; and a third step of forming the second dielectric and the first bonding sheet that cover one end of the first cover layer, and the third dielectric and the second bonding sheet that cover the other end of the first cover layer, by removing a part of the first and second bonding sheets connected to each other without being separated, and a part of the second and third dielectrics connected to each other without being separated, the part of the first and second bonding sheets and the part of the second and third dielectrics being positioned over the first cover layer except for a portion of the one end and the other end of the first cover layer.

A manufacturing method of a flexible circuit board with improved bending reliability according to an embodiment of the present invention includes a first step of preparing a first dielectric on which a first cover layer is positioned; a second step of coupling a second dielectric and a third dielectric that are connected to each other without being separated, onto the first dielectric; a third step of forming the second dielectric covering one end of the first cover layer and the third dielectric covering the other end of the first cover layer, by removing a part of the second and third dielectrics connected to each other without being separated, which is positioned over the first cover layer except for a portion of the one end and the other end of the first cover layer; a sixth step of coupling a third cover layer onto the second dielectric; and a seventh step of coupling a fourth cover layer onto the third dielectric.

Advantageous Effects

First, there is an effect of preventing the wiring part from being separated when the flexible circuit board is bent, because no step is formed and no gap is formed by interposing one end of the first cover layer between the first dielectric and the second dielectric and interposing the other end of the first cover layer between the first dielectric and the third dielectric.

In addition, the first cover layer and the first ground do not overlap in a vertical direction, and the first cover layer and the second ground do not overlap in the vertical direction, so that there is an effect of preventing an increase in thickness of the printed circuit board.

In addition, there is an effect that the first cover layer, the third cover layer, and the fourth cover layer can be formed to have different thicknesses.

In addition, by forming a thickness of the first cover layer to be thinner than that of the third and fourth cover layers, there is an effect of facilitating bending of the flexible circuit board.

Also, there is an effect of preventing the wiring part from being separated when the flexible circuit board is bent, because no step is formed and no gap is formed by interposing one end of the second cover layer between the first dielectric and the fourth dielectric and interposing the other end of the second cover layer between the first dielectric and the fifth dielectric.

Also, the second cover layer and the third ground do not overlap in the vertical direction, and the second cover layer and the fourth ground do not overlap in the vertical direction, so that there is an effect of preventing an increase in thickness of the printed circuit board.

In addition, the second cover layer, the fifth cover layer, and the sixth cover layer can be formed to have different thicknesses.

In addition, by forming a thickness of the second cover layer to be thinner than that of the fifth cover layer and the sixth cover layer, there is an effect of facilitating bending of the flexible circuit board.

Also, there is an effect of preventing damage to the wiring part as the first cover layer functions as a protective layer, when the second dielectric covering one end of the first cover layer and the third dielectric covering the other end of the first cover layer are formed by removing the dielectrics positioned over an inside portion of the first cover layer except for a certain length of both end portions of the first cover layer.

In addition, an effect of preventing damage to the wiring part as the first cover layer functions as a protective layer is applied to the second cover layer in the same manner.

DETAILED DESCRIPTION

A flexible circuit board for transmitting a high frequency signal is used within a wireless terminal (e.g., a smart phone, a tablet, or the like).

The flexible circuit board separately forms an area to be bent according to the need for bending due to a step difference in internal parts or a hinge of the wireless terminal.

Figure 1:
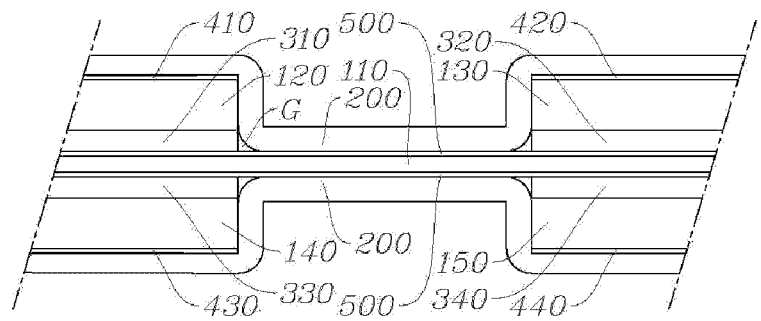
FIGS. 1 and 2 are cross-sectional views of a flexible circuit board with improved bending reliability according to a conventional problem.

As shown in FIG. 1, a thickness of an area to be bent of the flexible circuit board is formed to be less than that of other areas, thereby forming a step.

Figure 2:
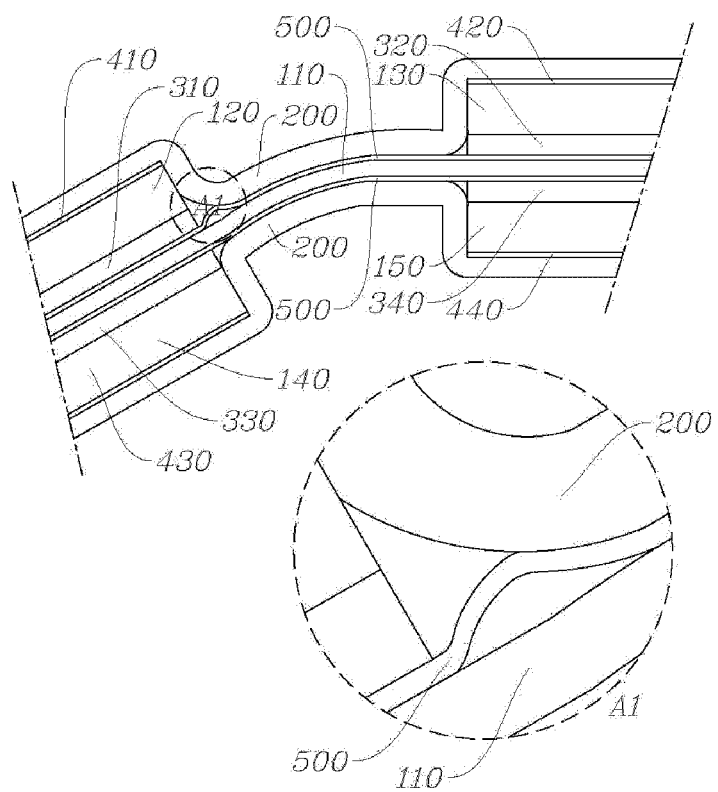

As shown in FIG. 2, by this step, there is a problem that a gap G, which is a part where a cover layer 200 covering an upper portion of the first dielectric 110 is separated from the upper portion of the first dielectric 110, is formed.

As shown in an enlarged view of portion A1 in FIG. 2, this problem is further problematic in that signal transmission is not normally performed since a wiring part 500 that is coupled to the cover layer 200 is separated together with the cover layer 200 in accordance with an increase in size of the gap G when bending the flexible circuit board.

Figure 3:
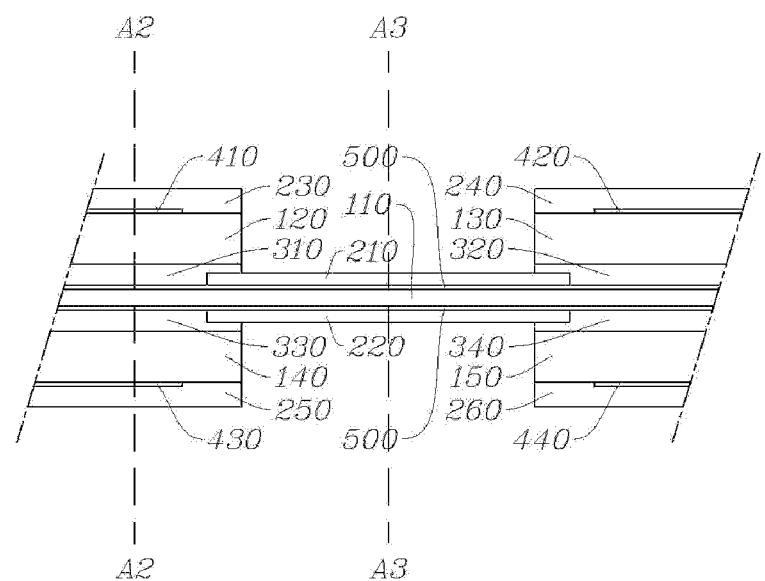
FIG. 3 to FIG. 5 are cross-sectional views of a flexible circuit board with improved bending reliability according to an embodiment of the present invention.

In order to solve this problem, a flexible circuit board having improved bending reliability according to an embodiment of the present invention includes a first dielectric 110, a second dielectric 120, a third dielectric 130, and a first cover layer 210, as shown in FIG. 3.

The first dielectric 110 is formed to be elongated in a horizontal direction, and the wiring part 500 is positioned on at least one of an upper surface and a lower surface of the first dielectric 110.

The second dielectric 120 is positioned above the first dielectric 110.

The third dielectric 130 is spaced apart from the second dielectric 120 in the horizontal direction and is positioned above the first dielectric 110.

The first cover layer 210 is positioned on the first dielectric 110 and covers an upper portion of the first dielectric 110 between the second dielectric 120 and the third dielectric 130.

One end of the first cover layer 210 is extended and interposed between the first dielectric 110 and the second dielectric 120, and the other end of the first cover layer 210 is extended and interposed between the first dielectric 110 and the third dielectric 130.

At this time, as shown in FIG. 3, a part of the first cover layer 210 in which one end of the first cover layer 210 is extended and interposed between the first dielectric 110 and the second dielectric 120 may be extended by a length less than a length of the second dielectric 120 and may be interposed only in a portion between the first dielectric 110 and the second dielectric 120.

Further, although not shown, it may be extended by the same length as the second dielectric 120 and may be interposed entirely between the first dielectric 110 and the second dielectric 120.

In addition, a part of the first cover layer 210 in which the other end of the first cover layer 210 is extended and interposed between the first dielectric 110 and the third dielectric 130 may be interposed only in a portion between the first dielectric 110 and the third dielectric 130 or may be interposed entirely between the first dielectric 110 and the third dielectric 130.

In this manner, there is an effect of preventing the wiring part 500 from being separated when the flexible circuit board is bent, because no step is formed and no gap G is formed by interposing one end of the first cover layer 210 between the first dielectric 110 and the second dielectric 120 and interposing the other end of the first cover layer 210 between the first dielectric 110 and the third dielectric 130.

The flexible circuit board having improved bending reliability according to an embodiment of the present invention includes a first bonding sheet 310 and a second bonding sheet 320, as shown in FIG. 3.

The first bonding sheet 310 is positioned between the first dielectric 110 and the second dielectric 120 and covers an upper portion of one end of the first cover layer 210.

The second bonding sheet 320 is positioned between the first dielectric 110 and the third dielectric 130 and covers an upper portion of the other end of the first cover layer 210.

That is, the second dielectric 120 and the third dielectric 130 are coupled to the first dielectric 110 through the first bonding sheet 310 and the second bonding sheet 320, respectively.

At this time, although not shown, the second dielectric 120 and the third dielectric 130 may be directly bonded to the first dielectric 110 by high-temperature thermal bonding without the first bonding sheet 310 and the second bonding sheet 320.

The flexible circuit board with improved bending reliability according to an embodiment of the present invention includes a first ground 410 and a second ground 420 as shown in FIG. 3.

First, as an example, there is an embodiment in which the first ground 410 is positioned on the second dielectric 120 and the second ground 420 is positioned on the third dielectric 130.

In addition, when the first ground 410 and the second ground 420 overlap one end and the other end of the first cover layer 210 in a vertical direction, respectively, there is a problem that a thickness of overlapping areas of the flexible circuit board increases. Another embodiment for solving this problem will be described as follows.

The first ground 410 is positioned on the second dielectric 120, while being positioned to be spaced apart from one end of the first cover layer 210 in the horizontal direction so as not to overlap the one end of the first cover layer 210 in the vertical direction.

The second ground 420 is positioned on the third dielectric 130, while being positioned to be spaced apart from the other end of the first cover layer 210 in the horizontal direction so as not to overlap the other end of the first cover layer 210 in the vertical direction.

That is, the first ground 410 is not positioned above one end of the first cover layer 210, and the first ground 410 is positioned on the second dielectric 120 where the one end of the first cover layer 210 is not positioned.

In addition, the second ground 420 is not positioned above the other end of the first cover layer 210 and the second ground 420 is positioned on the third dielectric 130 where the other end of the first cover layer 210 is not positioned.

In this manner, the first cover layer 210 and the first ground 410 do not overlap in the vertical direction, and the first cover layer 210 and the second ground 420 do not overlap in the vertical direction, so that there is an effect of preventing an increase in thickness of the printed circuit board.

The flexible circuit board with improved bending reliability according to an embodiment of the present invention includes a third cover layer 230 and a fourth cover layer 240, as shown in FIG. 3.

The third cover layer 230 is positioned on the second dielectric 120 to cover an upper portion of the first ground 410.

The fourth cover layer 240 is positioned on the third dielectric 130 to cover the second ground 420.

Conventionally, the first cover layer 210, the third cover layer 230, and the fourth cover layer 240 are configured to be connected to one another and have the same thickness, but the first cover layer 210, the third cover layer 230, and the fourth cover layer 240 of the present invention may be formed in separate configurations and have different thicknesses.

In particular, since bending is facilitated when a thickness of a bending area is thinner and a thickness of a non-bending area is thicker, a thickness of the first cover layer 210 that is included in the bending area may be formed to be less than the thickness of the third cover layer 230 and the fourth cover layer 240.

In this manner, there is an effect that the first cover layer 210, the third cover layer 230, and the fourth cover layer 240 can be formed to have different thicknesses.

In addition, by forming the thickness of the first cover layer 210 to be less than the thickness of the third cover layer 230 and the fourth cover layer 240, there is an effect of facilitating bending of the flexible circuit board.

Components above the first dielectric 110 have been described above, and next, components below the first dielectric 110 will be described.

In addition, the flexible circuit board may include at least the components above the first dielectric 110 described above, and the flexible circuit board may include at least components below the first dielectric 110 to be described next, and the flexible circuit board may be configured by including at least the components above the first dielectric 110 and components below the first dielectric 110.

A flexible circuit board with improved bending reliability according to an embodiment of the present invention includes a fourth dielectric 140, a fifth dielectric 150, and a second cover layer 220, as shown in FIG. 3.

The fourth dielectric 140 is positioned below the first dielectric 110, while being positioned to be line-symmetric with the second dielectric 120 with respect to the first dielectric 110.

The fifth dielectric 150 is spaced apart from the fourth dielectric 140 in the horizontal direction and is positioned below the first dielectric 110, while being positioned to be line-symmetric with the third dielectric 130 with respect to the first dielectric 110.

The second cover layer 220 is positioned under the first dielectric 110 and covers a lower portion of the first dielectric 110 between the fourth dielectric 140 and the fifth dielectric 150.

One end of the second cover layer 220 is extended and interposed between the first dielectric 110 and the fourth dielectric 140, and the other end of the second cover layer 220 is extended and interposed between the first dielectric 110 and the fifth dielectric 150.

At this time, as shown in FIG. 3, a part of the second cover layer 220 in which one end of the second cover layer 220 is extended and interposed between the first dielectric 110 and the fourth dielectric 140 may be extended by a length less than a length of the fourth dielectric 140 and may be interposed only in a portion between the first dielectric 110 and the fourth dielectric 140.

Further, although not shown, it may be extended by the same length as the fourth dielectric 140 and may be interposed entirely between the first dielectric 110 and the fourth dielectric 140.

In addition, the other end of the second cover layer 220 may be extended and interposed only in a portion between the first dielectric 110 and the fifth dielectric 150 or may be interposed entirely between the first dielectric 110 and the fifth dielectric 150.

In this manner, there is an effect of preventing the wiring part 500 from being separated when the flexible circuit board is bent, because no step is formed and no gap G is formed by interposing one end of the second cover layer 220 between the first dielectric 110 and the fourth dielectric 140 and interposing the other end of the second cover layer 220 between the first dielectric 110 and the fifth dielectric 150.

A flexible circuit board having improved bending reliability according to an embodiment of the present invention includes a third bonding sheet 330 and a fourth bonding sheet 340, as shown in FIG. 3.

The third bonding sheet 330 is positioned between the first dielectric 110 and the fourth dielectric 140 and covers a lower portion of one end of the second cover layer 220.

The fourth bonding sheet 340 is positioned between the first dielectric 110 and the fifth dielectric 150 and covers a lower portion of the other end of the second cover layer 220.

That is, the fourth dielectric 140 and the fifth dielectric 150 are coupled to the first dielectric 110 through the third bonding sheet 330 and the fourth bonding sheet 340, respectively.

At this time, although not shown, the fourth dielectric 140 and the fifth dielectric 150 can be directly bonded to the first dielectric 110 by high-temperature thermal bonding without the third bonding sheet 330 and the fourth bonding sheet 340.

The flexible circuit board with improved bending reliability according to an embodiment of the present invention includes a third ground 430 and a fourth ground 440, as shown in FIG. 3.

First, as an example, there is an embodiment in which the third ground 430 is positioned under the fourth dielectric 140, and the fourth ground 440 is positioned under the fifth dielectric 150.

In addition, when the third ground 430 and the fourth ground 440 overlap one end and the other end of the second cover layer 220 in the vertical direction, respectively, there is a problem that a thickness of overlapping areas of the flexible circuit board increases. Another embodiment for solving this problem will be described as follows.

The third ground 430 is positioned under the fourth dielectric 140, while being positioned to be spaced apart from one end of the second cover layer 220 in the horizontal direction so as not to overlap the one end of the second cover layer 220 in the vertical direction.

The fourth ground 440 is positioned under the fifth dielectric 150, while being positioned to be spaced apart from the other end of the second cover layer 220 in the horizontal direction so as not to overlap the other end of the second cover layer 220 in the vertical direction.

That is, the third ground 430 is not positioned below one end of the second cover layer 220, and the third ground 430 is positioned under the fourth dielectric 140 where the one end of the second cover layer 220 is not positioned.

In addition, the fourth ground 440 is not positioned below the other end of the second cover layer 220, and the fourth ground 440 is positioned under the fifth dielectric 150 where the other end of the second cover layer 220 is not positioned.

In this manner, the second cover layer 220 and the third ground 430 do not overlap in the vertical direction, and the second cover layer 220 and the fourth ground 440 do not overlap in the vertical direction, so that there is an effect of preventing an increase in thickness of the printed circuit board.

The flexible circuit board having improved bending reliability according to an embodiment of the present invention includes a fifth cover layer 250 and a sixth cover layer 260, as shown in FIG. 3.

The fifth cover layer 250 is positioned under the fourth dielectric 140 to cover a lower portion of the third ground 430.

The sixth cover layer 260 is positioned under the fifth dielectric 150 to cover a lower portion of the fourth ground 440.

The second cover layer 220, the fifth cover layer 250, and the sixth cover layer 260 may be formed in separate configurations and have different thicknesses.

Conventionally, the second cover layer 220, the fifth cover layer 250, and the sixth cover layer 260 are configured to be connected to one another and have the same thickness, but the second cover layer 220, the fifth cover layer 250 and the sixth cover layer 260 of the present invention may be formed in separate configurations and have different thicknesses.

In particular, since bending is facilitated when a thickness of a bending area is thinner and a thickness of a non-bending area is thicker, a thickness of second cover layer 220 that is included in the bending area may be formed to be less than the thickness of the fifth cover layer 250 and the sixth cover layer 260.

In this manner, the second cover layer 220, the fifth cover layer 250, and the sixth cover layer 260 can be formed to have different thicknesses.

In addition, by forming the thickness of the second cover layer 220 to be less than that of the fifth cover layer 250 and the sixth cover layer 260, there is an effect of facilitating bending of the flexible circuit board.

Figure 4:
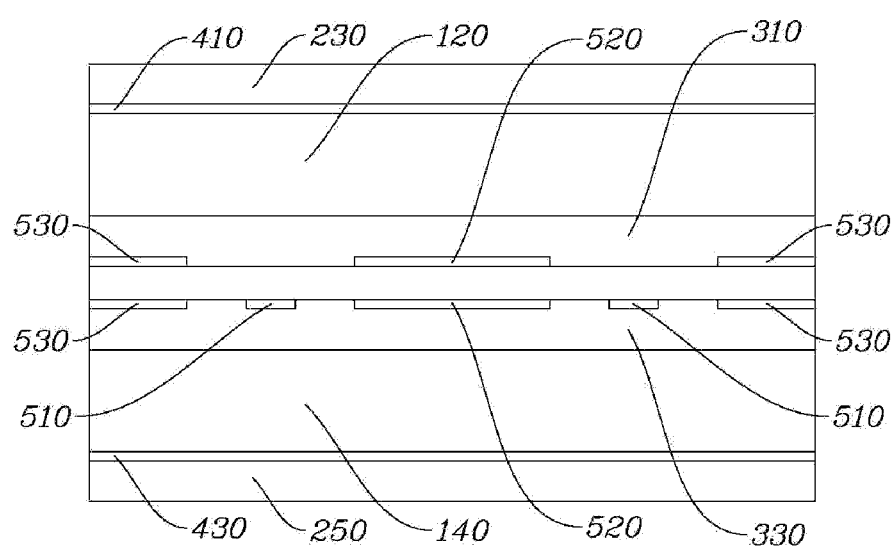
Figure 5:
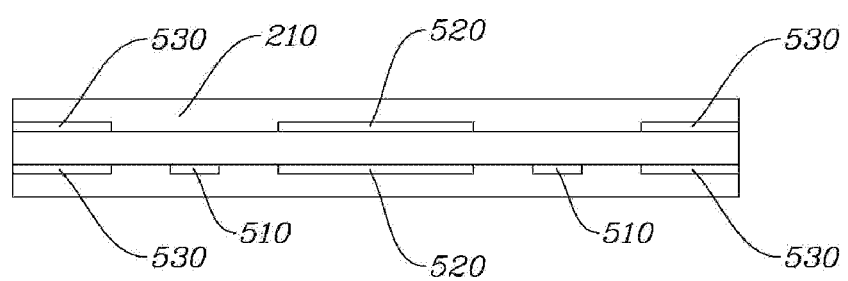

FIG. 4 is a cross-sectional view of portion A2 of FIG. 3, and FIG. 5 is a cross-sectional view of portion A3 of FIG. 3.

The wiring part 500 is positioned on at least one of the upper surface and the lower surface of the first dielectric 110.

The wiring part 500 includes signal lines 510 for transmitting at least one high frequency signal, and if necessary, grounds may be formed on a surface opposite to a surface of the first dielectric 110 on which the signal lines 510 are formed, and grounds may be formed on both sides spaced apart from a center of the signal lines 510.

As an example of this wiring part 500, as shown in FIGS. 4 and 5, center grounds 520 are positioned in the center of the upper and lower surfaces of the first dielectric 110, side grounds 530 are positioned at both sides spaced apart from the center grounds 520 on the upper and lowers of the first dielectric 110, and the signal lines 510 are positioned respectively between the center ground 520 and the side grounds 530 at the both sides on the upper and lowers of the first dielectric 110.

Although FIG. 4 and FIG. 5 illustrate that a pair of signal lines 510 are positioned on the lower surface of the first dielectric 110, a pair of signal lines 510 are positioned on the upper surface of the first dielectric 110, or one signal line 510 may be positioned on the lower surface of the first dielectric 110 and the other signal line 510 may be positioned on the upper surface of the first dielectric 110.

The center ground 520 and the side ground 530, between which the signal line 510 is not positioned, may be spaced apart from each other without connection portions as shown, may be partially connected to each other to form a pattern, or may be entirely connected to each other.

In this case, the pattern formed by partially connecting may include a shape in which figures are periodically arranged by unconnected portions, or may include a net shape by connected portions.

Figure 6:
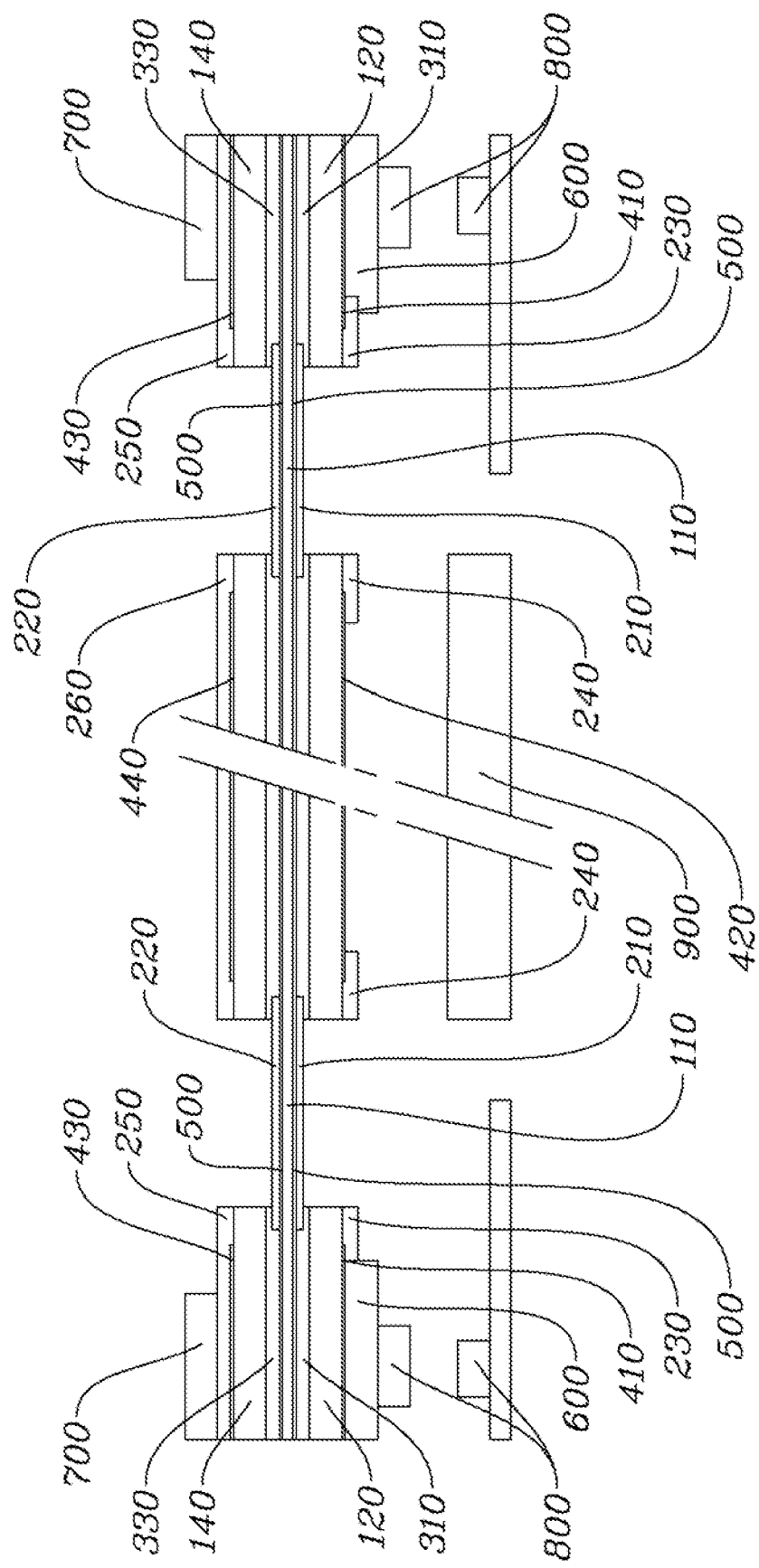
FIG. 6 is a cross-sectional view of a flexible circuit board with improved bending reliability according to another embodiment of the present invention.

Although it has been described that the third cover layer 230 previously explained with reference to FIG. 3 covers the upper portion of the second dielectric 120, the third cover layer 230 may be positioned on the second dielectric 120 with a length less than that of the second dielectric 120, a PSR (Photo Solder Resist) 600 may be positioned on the second dielectric 120 and cover an upper portion of one end of the third cover layer 230, and a connector 800 may be positioned on the PSR 600, as shown in FIG. 6.

In addition, a reinforcement plate 700 formed of a hard material may be positioned under the fifth cover layer 250 so that the connector 800 can be easily coupled to another connector 800 formed on a PCB or the like.

Although it has been described that the fourth cover layer 240 previously explained with reference to FIG. 3 covers the upper portion of the third dielectric 130, the fourth cover layer 240 may cover the second ground 420 positioned on the third dielectric 130, and an opening through which the second ground 420 is exposed may be formed in the fourth cover layer 240 so that a ground part 900 can be grounded with the second ground 420.

There are two embodiments of a manufacturing method of the flexible circuit board with improved bending reliability according to an embodiment of the present invention.

First, a first embodiment of the manufacturing method will be described as follows.

Figure 7:
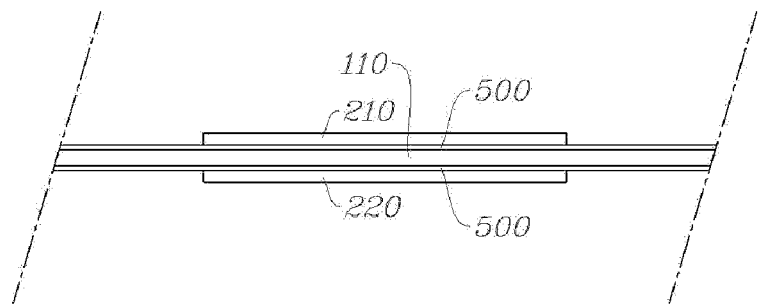
FIGS. 7 and 8 are cross-sectional views illustrating a first embodiment of a manufacturing method of the flexible circuit board with improved bending reliability according to an embodiment of the present invention.
Figure 8:
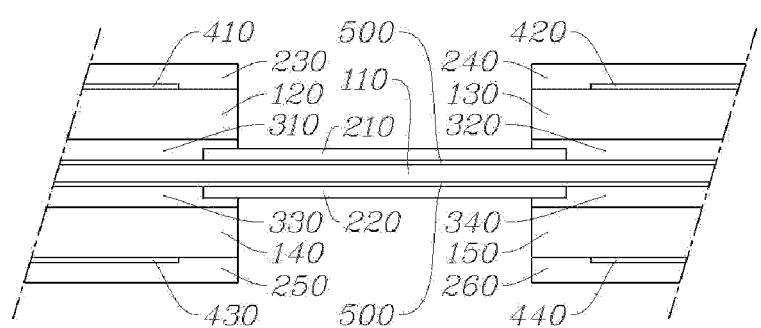

FIG. 7 is an illustration of a first step, and FIG. 8 is an illustration of a second step to a ninth step.

In the first step, the wiring part 500 is positioned on at least one of the upper and lowers of the first dielectric 110, and the first cover layer 210 is positioned on the first dielectric 110 to thereby prepare the first dielectric 110.

In the second step, the second dielectric 120 is combined onto the first dielectric 110 to cover one end of the first cover layer 210.

In a third step, the third dielectric 130 is spaced apart from the second dielectric 120 in the horizontal direction and is combined onto the first dielectric 110 to cover the other end of the first cover layer 210.

In a fourth step, the third cover layer 230 is combined onto the second dielectric 120.

In a fifth step, the fourth cover layer 240 is combined onto the third dielectric 130.

In this case, the second step and the third step may be performed sequentially and may be performed simultaneously.

In addition, the fourth step and the fifth step may be performed sequentially and may be performed simultaneously.

In a sixth step, the second cover layer 220 is positioned under the first dielectric 110, and the fourth dielectric 140 is combined with a lower portion of the first dielectric 110 to cover one end of the second cover layer 220.

In a seventh step, the fifth dielectric 150 is spaced apart from the fourth dielectric 140 in the horizontal direction and is combined with the lower portion of the first dielectric 110 to cover the other end of the second cover layer 220.

In an eighth step, the fifth cover layer 250 is combined with a lower portion of the fourth dielectric 140.

In the ninth step, the sixth cover layer 260 is combined with a lower portion of the fifth dielectric 150.

In this case, the sixth step and the seventh step may be performed sequentially or may be performed simultaneously.

In addition, the eighth step and the ninth step may be performed sequentially or may be performed simultaneously.

The above-described steps may be performed in whole or in part as necessary.

For example, the first step to the fifth step may be performed, and the sixth to the ninth step may not be performed.

Next, a second embodiment of the manufacturing method will be described as follows.

Figure 9:
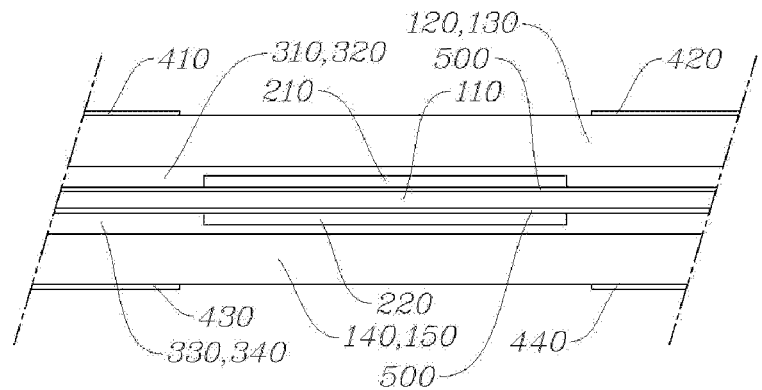
FIGS. 9 and 10 are cross-sectional views illustrating a first embodiment of a manufacturing method of the flexible circuit board with improved bending reliability according to an embodiment of the present invention.
Figure 10:
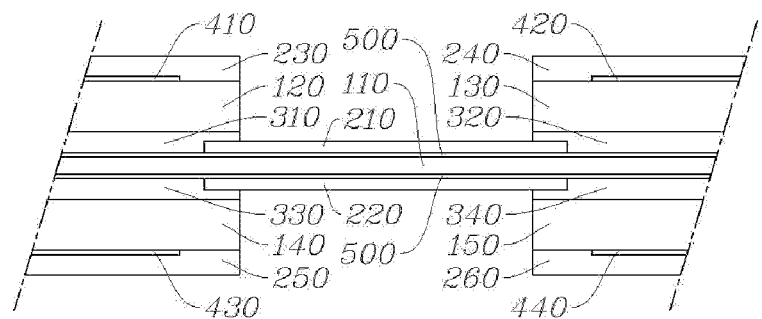

FIG. 9 is an illustration of a first step and a second step, and FIG. 10 is an illustration of a third step to a ninth step.

In the first step, the wiring part 500 is positioned on at least one of the upper and lowers of the first dielectric 110, and the first cover layer 210 is positioned on the first dielectric 110 to thereby prepare the first dielectric 110.

In the second step, the second dielectric 120 and the third dielectric 130 that are connected to each other without being separated are combined onto the first dielectric 110.

In the third step, a part of the second dielectric 120 and the third dielectric 130 connected to each other without being separated, which is positioned over the first cover layer 210 except for a portion of one end and the other end of the first cover layer 210 is removed, so that the second dielectric 120 covering one end of the first cover layer 210 and the third dielectric 130 covering the other end of the first cover layer 210 are formed.

In a fourth step, the fourth dielectric 140 and the fifth dielectric 150 that are connected to each other without being separated are combined with the lower portion of the first dielectric 110.

In a fifth step, a part of the fourth dielectric 140 and the fifth dielectric 150 connected to each other without being separated, which is positioned under the second cover layer 220 except for a portion of one end and the other end of the second cover layer 220 is removed, so that the fourth dielectric 140 covering one end of the second cover layer 220 and the fifth dielectric 150 covering the other end of the second cover layer 220 are formed.

At this time, the removal of the part of the second dielectric 120 and the third dielectric 130, which is positioned over the first cover layer 210, and the removal of the part of the fourth dielectric 140 and the fifth dielectric 150, which is positioned under the second cover layer 220, may be performed by a method using a laser or a knife. This removal method may damage the wiring part 500 positioned on the first dielectric 110, but since the first cover layer 210 covers the wiring part 500, it is possible to prevent the wiring part 500 from being damaged.

In this manner, there is an effect of preventing damage to the wiring part 500 as the first cover layer 210 functions as a protective layer, when the second dielectric 120 covering one end of the first cover layer 210 and the third dielectric 130 covering the other end of the first cover layer 210 are formed by removing the dielectrics positioned over an inside portion of the first cover layer 210 except for a certain length of both end portions of the first cover layer 210.

In addition, the effect of preventing damage to the wiring part 500 as the first cover layer 210 functions as a protective layer is applied to the second cover layer 220 in the same manner.

Following the fifth step, in a sixth step, the third cover layer 230 is combined onto the second dielectric 120.

In a seventh step, the fourth cover layer 240 is combined onto the third dielectric 130.

In an eighth step, the fifth cover layer 250 is combined onto the fourth dielectric 140.

In a ninth step, the sixth cover layer 260 is combined onto the fifth dielectric 150.

The above-described steps can be performed in whole or in part as necessary.

In this case, the sixth step and the seventh step may be performed sequentially or may be performed simultaneously.

In addition, the eighth step and the ninth step may be performed sequentially or may be performed simultaneously.

For example, the first step to the third step, and the sixth step and the seventh step may be performed, while the fourth step, the fifth step, the eight step and the ninth step may not be performed.

[DESCRIPTION OF REFERENCE NUMERALS]

| | |
|---|---|
| 110: first dielectric | 120: second dielectric |
| 130: third dielectric | 140: fourth dielectric |
| 150: fifth dielectric | 200: cover layer |
| 210: first cover layer | 220: second cover layer |
| 230: third cover layer | 240: fourth cover layer |
| 250: fifth cover layer | 260: sixth cover layer |
| 310: first bonding sheet | 320: second bonding sheet |
| 330: third bonding sheet | 340: fourth bonding sheet |
| 410: first ground | 420: second ground |
| 430: third ground | 440: fourth ground |
| 500: wiring part | 510: signal line |
| 520: center ground | 530: side ground |
| 600: PSR | 700: reinforcement plate |
| 800: connector | 900: ground part |
| G: gap | |

We claim:

1. A flexible circuit board with improved bending reliability, the flexible circuit board comprising:
a first dielectric formed to be elongated in a horizontal direction;
a second dielectric positioned above the first dielectric;
a third dielectric spaced apart from the second dielectric in the horizontal direction and positioned above the first dielectric;
a first cover layer positioned on the first dielectric and covering an upper portion of the first dielectric between the second dielectric and the third dielectric;
a first bonding sheet positioned between the first dielectric and the second dielectric and covering an upper portion of one end of the first cover layer; and
a second bonding sheet positioned between the first dielectric and the third dielectric and covering an upper portion of the other end of the first cover layer,
wherein one end of the first cover layer is extended and interposed between the first dielectric and the second dielectric,
wherein the other end of the first cover layer is extended and interposed between the first dielectric and the third dielectric; and
wherein the flexible circuit board further comprises:
a first ground positioned on the second dielectric, while being positioned to be spaced apart from one end of the first cover layer in the horizontal direction so as not to overlap the one end of the first cover layer in a vertical direction; and
a second ground positioned on the third dielectric, while being positioned to be spaced apart from the other end of the first cover layer in the horizontal direction so as not to overlap the other end of the first cover layer in the vertical direction.

2. A flexible circuit board with improved bending reliability, the flexible circuit board comprising:
a first dielectric formed to be elongated in a horizontal direction;
a second dielectric positioned above the first dielectric;
a third dielectric spaced apart from the second dielectric in the horizontal direction and positioned above the first dielectric;
a first cover layer positioned on the first dielectric and covering an upper portion of the first dielectric between the second dielectric and the third dielectric;
a third cover layer positioned on the second dielectric; and
a fourth cover layer positioned on the third dielectric,
wherein one end of the first cover layer is extended and interposed between the first dielectric and the second dielectric,
wherein the other end of the first cover layer is extended and interposed between the first dielectric and the third dielectric,
wherein a thickness of the first cover layer is formed to be less than a thickness of the third cover layer and the fourth cover layer.

3. A flexible circuit board with improved bending reliability, the flexible circuit board comprising:
a first dielectric formed to be elongated in a horizontal direction;
a second dielectric positioned above the first dielectric;
a third dielectric spaced apart from the second dielectric in the horizontal direction and positioned above the first dielectric;
a first cover layer positioned on the first dielectric and covering an upper portion of the first dielectric between the second dielectric and the third dielectric;
a fourth dielectric positioned below the first dielectric, while being positioned to be line-symmetric with the second dielectric with respect to the first dielectric;
a fifth dielectric spaced apart from the fourth dielectric in the horizontal direction and positioned below the first dielectric, while being positioned to be line-symmetric with the third dielectric with respect to the first dielectric; and
a second cover layer positioned under the first dielectric and covering a lower portion of the first dielectric between the fourth dielectric and the fifth dielectric;
wherein one end of the first cover layer is extended and interposed between the first dielectric and the second dielectric,
wherein the other end of the first cover layer is extended and interposed between the first dielectric and the third dielectric,
wherein one end of the second cover layer is extended and positioned between the first dielectric and the fourth dielectric,
wherein the other end of the second cover layer is extended and positioned between the first dielectric and the fifth dielectric, and
wherein the flexible circuit board further comprises:
a third bonding sheet positioned between the first dielectric and the fourth dielectric and covering a lower portion of one end of the second cover layer;
a fourth bonding sheet positioned between the first dielectric and the fifth dielectric and covering a lower portion of the other end of the second cover layer;
a third ground positioned under the fourth dielectric, while being positioned to be spaced apart from one end of the second cover layer in the horizontal direction so as not to overlap the one end of the second cover layer in a vertical direction; and
a fourth ground positioned under the fifth dielectric, while being positioned to be spaced apart from the other end of the second cover layer in the horizontal direction so as not to overlap the other end of the second cover layer in the vertical direction.

4. The flexible circuit board of claim 3, comprising:
a fifth cover layer positioned under the fourth dielectric; and
a sixth cover layer positioned under the fifth dielectric,
wherein a thickness of the second cover layer is formed to be less than a thickness of the fifth cover layer and the sixth cover layer.

5. A flexible circuit board with improved bending reliability, the flexible circuit board comprising:
a first dielectric formed to be elongated in a horizontal direction;
a second dielectric positioned above the first dielectric;
a third dielectric spaced apart from the second dielectric in the horizontal direction and positioned above the first dielectric;
a first cover layer positioned on the first dielectric and covering an upper portion of the first dielectric between the second dielectric and the third dielectric;
a third cover layer positioned on the second dielectric;
a PSR positioned on the second dielectric and covering an upper portion of one end of the third cover layer; and
a connector positioned on the PSR,
wherein one end of the first cover layer is extended and interposed between the first dielectric and the second dielectric,
wherein the other end of the first cover layer is extended and interposed between the first dielectric and the third dielectric, and
wherein the flexible circuit board further comprises:
a second ground positioned on the third dielectric; and
a fourth cover layer positioned on the third dielectric and covering the second ground,
wherein an opening through which the second ground is exposed is formed in the fourth cover layer so that a ground part is able to be grounded with the second ground.

6. A manufacturing method of a flexible circuit board with improved bending reliability, the manufacturing method comprising:
a first step of preparing a first dielectric on which a first cover layer is positioned;
a second step of coupling a second dielectric onto the first dielectric through a first bonding sheet to cover one end of the first cover layer;
a third step of spacing a third dielectric apart from the second dielectric in a horizontal direction, and coupling the third dielectric onto the first dielectric through a second bonding sheet to cover the other end of the first cover layer;
a first ground positioned on the second dielectric, while being positioned to be spaced apart from one end of the first cover layer in the horizontal direction so as not to overlap the one end of the first cover layer in a vertical direction; and
a second ground positioned on the third dielectric, while being positioned to be spaced apart from the other end of the first cover layer in the horizontal direction so as not to overlap the other end of the first cover layer in the vertical direction.

7. A manufacturing method of a flexible circuit board with improved bending reliability, the manufacturing method comprising:
a first step of preparing a first dielectric on which a first cover layer is positioned;
a second step of coupling a second dielectric onto the first dielectric to cover one end of the first cover layer;
a third step of spacing a third dielectric apart from the second dielectric in a horizontal direction, and coupling the third dielectric onto the first dielectric to cover the other end of the first cover layer;
a fourth step of coupling a third cover layer onto the second dielectric; and
a fifth step of coupling a fourth cover layer onto the third dielectric,
wherein a thickness of the first cover layer is formed to be less than a thickness of the third cover layer and the fourth cover layer.

8. A manufacturing method of a flexible circuit board with improved bending reliability, the manufacturing method comprising:
a first step of preparing a first dielectric on which a first cover layer is positioned;
a second step of coupling a second dielectric and a third dielectric that are connected to each other without being separated, onto the first dielectric, wherein the first dielectric and the second and third dielectrics connected to each other are coupled through a first bonding sheet and a second bonding sheet that are connected to each other without being separated; and
a third step of forming the second dielectric and the first bonding sheet that cover one end of the first cover layer, and the third dielectric and the second bonding sheet that cover the other end of the first cover layer, by removing a part of the first and second bonding sheets connected to each other without being separated, and a part of the second and third dielectrics connected to each other without being separated, the part of the first and second bonding sheets and the part of the second and third dielectrics being positioned over the first cover layer except for a portion of the one end and the other end of the first cover layer.

9. A manufacturing method of a flexible circuit board with improved bending reliability, the manufacturing method comprising:
a first step of preparing a first dielectric on which a first cover layer is positioned;
a second step of coupling a second dielectric and a third dielectric that are connected to each other without being separated, onto the first dielectric;
a third step of forming the second dielectric covering one end of the first cover layer and the third dielectric covering the other end of the first cover layer, by removing a part of the second and third dielectrics connected to each other without being separated, which is positioned over the first cover layer except for a portion of the one end and the other end of the first cover layer;
a sixth step of coupling a third cover layer onto the second dielectric; and
a seventh step of coupling a fourth cover layer onto the third dielectric.

* * * * *